United States Patent [19]
Leenders et al.

[11] Patent Number: 5,882,839
[45] Date of Patent: Mar. 16, 1999

[54] TYPE OF PHOTOSENSITIVE ELEMENT AND A PROCESS OF FORMING A METAL IMAGE WITH IT

[75] Inventors: Luc Leenders; Eddie Daems, both of Herentals; Robert Van Haute, Temse; Rita Torfs, Herenthout, all of Belgium

[73] Assignee: Afga-Gevaert, Mortsel, Belgium

[21] Appl. No.: 686,319

[22] Filed: Jul. 25, 1996

[30] Foreign Application Priority Data

Aug. 8, 1995 [EP] European Pat. Off. .............. 95202160

[51] Int. Cl.⁶ ....................................................... G03C 1/90
[52] U.S. Cl. ............................................ 430/258; 430/263
[58] Field of Search .................................... 430/252, 258, 430/263, 306

[56] References Cited

U.S. PATENT DOCUMENTS

| | | | |
|---|---|---|---|
| 4,081,282 | 3/1978 | Merrill et al. ................................ | 96/77 |
| 4,205,989 | 6/1980 | Moriya et al. ............................ | 430/306 |
| 4,751,167 | 6/1988 | Yamagata et al. ....................... | 430/263 |

FOREIGN PATENT DOCUMENTS

| | | |
|---|---|---|
| 2716422 | 4/1977 | Germany . |
| 1532307 | 10/1976 | United Kingdom . |

OTHER PUBLICATIONS

"Photodelamination Process" by Hant et al.; Research Disclosure, No. 222, Oct. 1982 Havant GB, pp. 329–330.
Patent Abstracts of Japan, vol. 009, No. 090 (P–350), Apr. 19, 1985 and JP–A–59 218446 (Mita Kogyo KK), Dec. 8, 1984.

*Primary Examiner*—John Goodrow
*Attorney, Agent, or Firm*—Baker & Botts, L.L.P.

[57] ABSTRACT

A photosensitive element is disclosed, and a process of forming an image with it, comprising, in order, a support with an optional subbing layer (1), a metal image forming layer, a photosensitive layer, and a transparent cover sheet with an optional subbing layer (2).

After exposure a delamination step is performed thereby giving rise to a positive and a negative metal image. In a most preferred embodiment the metal layer is a bismuth layer.

18 Claims, 1 Drawing Sheet

TYPE OF PHOTOSENSITIVE ELEMENT AND A PROCESS OF FORMING A METAL IMAGE WITH IT

DESCRIPTION

1. FIELD OF THE INVENTION

The present invention relates to an image forming material comprising a thin metal layer and to a method for the formation of a photo mode image.

2. BACKGROUND OF THE INVENTION

Conventional photographic materials based on silver halide are used for a large variety of applications. For instance, in the pre-press sector of graphic arts rather sensitive camera materials are used for obtaining screened images. Scan films are used for producing colour separations from multicolour originals. Phototype setting materials record the information fed to phototype- and image setters. Relative insensitive photographic materials serve as duplicating materials usually in a contact exposure process. Other fields include materials for medical recording, duplicating and hard copy, X-ray materials for non-destructive testing, black-and-white and colour materials for amateur- and professional still photography and materials for cinematographic recording and printing.

Silver halide materials have the advantage of high potential intrinsic sensitivity and excellent image quality. On the other hand they show the drawback of requiring several wet processing steps employing chemical ingredients which are suspect from an ecological point of view. As a consequence it is undesirable that depleted processing solutions would be discharged into the public sewerage; they have to be collected and destroyed by combustion, a cumbersome and expensive process.

In the past several proposals have been made for obtaining an image that can be formed using only dry development steps without the need of processing liquids as it is the case with silver halide photographic materials.

A dry imaging system known since quite a while is 3M's dry silver technology. It is a catalytic process which couples the light-capturing capability of silver halide to the image-forming capability of organic silver salts.

As a further alternative for conventional silver halide chemistry dry imaging elements are known that can be image-wise exposed using an image-wise distribution of heat. When this heat pattern is indirectly generated by the conversion of radiation, e.g. laser radiation, into heat these types of dry imaging elements are called heat mode materials. When the heat pattern is provided directly, e.g. by means of a thermal head, these elements are called thermal recording materials or thermographic materials. Both types of elements offer the advantage in addition to an ecological advantage that they do not need to be handled in a dark room nor any other protection from ambient light is needed. Heat mode recording materials, based on change of adhesion, are disclosed in e.g. U.S. Pat. No. 4,123,309, U.S. Pat. No. 4,123,578, U.S. Pat. No. 4,157,412, U.S. Pat. No. 4,547,456 and PCT applications WO 88/04237 and WO 93/03928.

In still another type of heat mode recording materials information is recorded by creating differences in reflection and/or transmission in the recording layer. The recording layer has high optical density. The conversion of radiation into heat brings about a local temperature rise, causing a change such as evaporation or ablation to take place in the recording layer. As a result, the irradiated parts of the recording layer are totally or partially removed, and a difference in optical density is formed between the irradiated parts and the unirradiated parts (cf. U.S. Pat. Nos. 4,216,501, 4,233,626, 4,188,214 and 4,291,119 and British Pat. No. 2,026,346). In a preferred embodiment the recording layer of such heat mode recording materials is constituted by a thin metal, e.g. a bismuth layer.

Still another type of non-conventional materials as alternative for silver halide is based on photopolymerisation. The use of photopolymerizable compositions for the production of images by information-wise exposure thereof to actinic radiation is known since quite a while. All these methods are based on the principle of introducing a differentiation in properties between the exposed and non-exposed parts of the photopolymerizable composition e.g. a difference in solubility, adhesion, conductivity, refractive index, tackiness, permeability, diffusibility of incorporated substances e.g. dyes etc. Some of the thus produced differences may be subsequently employed in a dry treatment step to produce a visible image and/or master for printing e.g. a lithographic or electrostatic printing master. in U.S. Pat. No. 4,751,167 an image forming material, working according to photo mode, is described comprising a substrate, an image producing layer constituted by a metal or metal compound layer, and a photopolymerisable layer containing a specific type of monomer. When not yet exposed the adhesion between the image producing layer and the photosensitive layer is lower than the adhesion between the substrate and the photosensitive layer, while upon exposure this adhesion balance is reversed. As a result, after peeling apart by means of a cover film a positive metal image is removed with the photosensitive layer and the cover sheet in the exposed areas while a negative metal image is retained on the substrate in the unexposed areas. A disadvantage of this method is the fact that both formed metal images are unprotected to physical damages, e.g. to scratches.

The present invention further extends the teachings on the combination of photopolymerisation and metal image forming layer.

It is an object of the present invention to provide an unconventional image forming material, based on photo mode, which constitutes an alternative to conventional image-setting films and contact duplicating films based on silver halide.

It is a further object to provide a process for the formation of a positive metal image which is protected against physical damages.

3. SUMMARY OF THE INVENTION

The objects of the present invention are realized by providing a process, and a image forming element for use with it, for the formation of a metal image comprising the following steps:

(A) exposing information-wise by actinic radiation a photosensitive element comprising, in order,:
  a support with an optional subbing layer (1),
  an image forming layer constituted by at least one layer made from a material selected from among a metal, a metal compound and a mixture of a metal and a metal compound,
  a photosensitive layer comprising a free radical polymerisable monomer having at least two ethylenically unsaturated groups, a binder and optionally a photoinitiator,
  a transparent cover sheet with an optional subbing layer (2), and, in which, when said material has not yet been exposed to actinic radiation, the cohesive strenght of said photosensitive layer is lower than both the adhesive strenght between said metal layer and said support or said subbing layer (1) when present and the adhesive strenght between said photosensitive layer and said cover sheet or said subbing layer (2) when present, whereas, upon exposure to actinic radiation, the cohesive strenght of said photopolymerised photosensitive layer and the adhesive strenght of said photopolymerised photosensitive layer to said metal layer both become higher than the adhesive strenght between said metal layer and said support or said subbing layer (1) when present, (B) peeling apart said support and said cover sheet, whereby, in the unexposed areas, said metal layer and part of the cohesively broken photosensitive layer adhere to the support or to the subbing layer (1) when present thus forming a positive metal image, whereas in the exposed areas the photopolymerised photosensitive layer and the metal layer adhere to said cover sheet or said subbing layer (2) when present thus forming a negative image.

In a most preferred embodiment of the present invention the image forming layer is a bismuth layer that is applied by evaporation under vacuum to a polyester support which is optionally provided with a subbing layer.

4. DETAILED DESCRIPTION OF THE INVENTION

First the particular features and ingredients of the photosensitive element for use in the method of the present invention will now be explained in detail hereinafter.

Suitable transparent supports include e.g. cellulose nitrate film, cellulose acetate film, polyvinyl acetal) film, polystyrene film, polyethylene terephthalate) film (PET), polycarbonate film, polyvinylchloride film or poly-α-olefin films such as polyethylene or polypropylene film. The thickness of such organic resin film is preferably comprised between 0.025 and 0.25 mm. Suitable opaque supports include resin coated paper and opacified PET.

In a most preferred embodiment the support is a polyethylene terephthalate support, preferably provided with a subbing layer. An example of a suitable subbing layer is a layer containing a polymer containing covalently bound chlorine. Suitable chlorine containing polymers are e.g. polyvinyl chloride, polyvinylidene chloride, a copolymer of vinylene chloride, an acrylic ester and itaconic acid, a copolymer of vinyl chloride and vinylidene chloride, a copolymer of vinyl chloride and vinyl acetate, a copolymer of butylacrylate, vinyl acetate and vinyl chloride or vinylidene chloride, a copolymer of vinyl chloride, vinylidene chloride and itaconic acid, a copolymer of vinyl chloride, vinyl acetate and vinyl alcohol, chlorinated polyethylene, polychloroprene and copolymers therof, chlorosulfonated polyethylene, polychlorotrifluoroethylene, polymethyl-alpha-chloroacrylate etc. A preferred chlorine containing polymer is co(vinylidenechloride-methylacrylate-itaconic acid; 88%/10%:2%).

Suitable polymers not containing chlorine include co(styrene-butadiene-carbonic acid), polyvinyl acetate, and co(methylmethacrylate-butadiene-itaconic acid). In the latter case the amount of the itaconic acid part is preferably comprised between 2 and 15%. The $T_g$ of the polymer can be adjusted by varying the relative amounts of the methylmethacrylate and the butadiene parts while keeping the itaconic acid part constant at about 5%. A preferred polymer not containing chlorine is composed of 47.5% of methylmethacrylate, 47.5% of butadiene and 5% of itaconic acid. However chlorine containing polymers are preferred.

To a support as described above optionally provided with a subbing layer, an image forming layer made from a material selected from a thin metal, a metal compound and a mixture of both, is applied by evaporation under vacuum. In the most preferred embodiment of the present invention the image forming layer is a bismuth layer. By carefully controlling the partial oxygen pressure in the vacuum chamber the physical characteristics of the applied metal layer can be adjusted. It was experimentally established that the less the vacuum the less metallic the nature of the metal layer was.

Preferred physical characteristics of the bismuth layer are summarized in following table

| Physical property | preferred range |
| --- | --- |
| optical density | $\geq 3.0$ |
| lateral resistance | $\geq 135 \Omega$ |
| specific resistance | $\geq 2 \cdot 10^{-3} \, \Omega \cdot cm$ |
| mass coverage (?) | $\pm 120 \, \mu g/cm^2$ |
| density ($\rho$) (theoretical: $\rho_T = 9.75$) | $\leq 7 \, g/cm^3$ |
| porosity ($\rho/\rho_T$) | $\pm 65\%$ |
| BET area (??) ($m^2/g$) | $\geq 0.6$ |
| crystallite size | 35 à 80 nm |
| $Bi_xO_y$ content | >20% |
| crystal structure | weakly oriented |
| optical reflection of Bi side (500 nm) | <10% |

The essential ingredients of the photosensitive layer are a binder, a monomer and (optionally) a photoinitiator. The presence of the latter is required when the actinic radiation used for the image-wise exposure is UV or visible light, but is superfluous when the actinic radiation is an electron beam.

From the various binders that can be used in the photosensitive layer we mention : polymethylmethacrylate (M.W. 100,000—$T_g$ 97° C.), polyvinyl acetate (M.W. 1,500,000—$T_g$ 29° C.), co(styrene-butylmethacrylate) (Degussa M.W. 50,000—$T_g$ 64° C.), polyvinylbutyral (BUTVAR B-79—Monsanto—M.W. 36,000—$T_g$ 76° C.), polyvinylformal (FORMVAR 12/85 (Monsanto) or VINILEC K (Chisso Co.)—M.W. 30,000—$T_g$ 88° and 80° C. resp.) and co(vinylchloridevinylacetate-maleic acid (BAKELITE VMCH—Union Carbide—M.W. 21.700—$T_g$ 74° C.). However, preference is given to various types of copolyesters having a glass transition temperature above 10° C. and preferably not above 85° C. Useful examples are : VITEL PE200 ($T_g$) 75° C.), VITEL PE222 ($T_g$ 47° C.), VITEL VPE-5987A ($T_g$ 27° C.), all available from Goodyear Chemicals, and DYNAPOL L206 ($T_g$ 65°–70° C.), DYNAPOL L411 ($T_g$ 45°–50° C.), DYNAPOL L850 ($T_g$ 40°–45° C.), DYNAPOL L858 ($T_g$ 45°–50° C.), DYNAPOL L860 ($T_g$ 35°–40° C.), all available from Hüls Troisdorf AG.

A wide variety of photopolymerisable and photocrosslinkable compounds can be used in the present invention. Suitable monomers include e.g. the monomers disclosed in DE-OS Nos. 4005231, 3516256, 3516257, 3632657 and U.S. Pat. No. 4,629,676, unsaturated esters of polyols, particularly such esters of the alpha-methylene carboxylic acids, e.g. ethylene diacrylate, glycerol tri(meth)acrylate, diethyleneglycol dimethacrylate, 1,3-propanediol di(meth)acrylate 1,2,4-butanetriol tri(meth)acrylate, 1,4-cyclohexanediol di(meth)acrylate, 1,4-benzenediol di(meth) acrylate, pentaerythritol tetra(meth)acrylate, pentaerythritol triacrylate, dipentaerythritol pentacrylate, trimethylolpropane triacrylate, 1,5-pentanediol di(meth)acrylate, the bis acrylates and methacrylates of polyethylene glycols of molecular weight 200–500, and the like unsaturated amides, particularly those of the alphamethylene carboxylic acids, and especially those of Alpha-Omega-diamines and oxygen-interrupted omega-diamines, such as methylene bis-acrylamide, methylene bis-methacrylamide, 1,6-hexamethylene bis-acrylamide, diethylene triamine tris-methacrylamide, bis (gamma-methacrylamidopropoxy) ethane, beta-methacrylamidoethyl methacrylate, N-(beta-hydroxyethyl)-beta-(methacrylamido)ethyl acrylate and N,N-bis(beta-methacrylolyoxyethyl)acrylamide, vinyl esters e.g. divinyl succinate, divinyl adipate, divinyl phthalate, divinyl butane-1,4-disulphonate; and unsaturated aldehydes, e.g. sorbaldehyde (hexadienal). The photopolymerizable composition may also comprise polymers and/or oligomers comprising 2 or more polymerizable functions e.g. acrylated epoxies, polyester acrylates, urethane acrylates etc. It will be clear that these monomers and/or polymers and/or oligomers can be used in admixture.

It is also possible to use monofunctional (meth)acrylic acid esters as monomer provided they are not to volatile and do not spread an unwanted odour. Suitable compounds include n-octylacrylate, n-octylmethacrylate, decylacrylate, decylmethacrylate, stearylacrylate, stearylmethacrylate, cyclohexylacrylate, cyclohexylmethacrylate, phenylethylacrylate, phenylethylmethacrylate.

The most preferred polymerizable compounds comprise one or more (meth)acrylate functional groups.

Particular preferred classes of photopolymerizable compounds containing (a) (meth)acrylate group(s) are reactive multifunctional monomers disclosed in EP 0 502 562 and represented by general formula (I) or (II):

(I)

wherein n represents an integer from 1 to 3, m equals an integer of 3 to 6 when n equals 1, and 2 to 6 when n equals 2 or 3, and u equals 0 or 1;

A represents an organic group of the following nature being 3 to 6 valent when n equals 1 and being 2 to 6 valent when n equals 2 or 3:

a) a hydrocarbon residue containing 5 to 25 carbon atoms which may be interrupted by one or more ether, ester or amide functions;

b)

with $A^1$ representing a linear or branched aliphatic residue that may contain 0 to 3 O-atoms and 2 to 20 C-atoms, an aromatic residue containing 6 to 24 carbon atoms, an aromatic aliphatic residue containing 7 to 28 C-atoms or an cycloalipliatic residue containing 6 to 26 C-atoms, $R^3$ and $R^4$ each independently representing a hydrogen or a methyl group, $A^2$ representing a hydrocarbon residue containing 5 to 25 carbon atoms, o represents an integer of 0 to 5 and p represents an integer of 2 to 6 when n equals 2 or 3 and represents an integer of 3 to 6 when n equals 1;

c)

wherein $A^1$, $A^2$, $R^3$, $R^4$, o and p have the same meaning as defined above d)

wherein $A^1$, $A^2$, $R^3$, $R^4$, o and p have the same meaning as defined above;

G represents —O—CO—NH—Y(—COO—)$_q$—;
    wherein Y represents a divalent (cyclo)aliphatic residue containing 2 to 15 C-atoms and that may contain an ester, ether or urethane function, and q represents 0 or 1

Q represents a linear or branched aliphatic hydrocarbon residue containing 3 to 15 carbon atoms and which may comprise 1 to 3 oxygen bridges and r equals 0 or 1,

X represents O or $NR^2$, $L^1$ represents an aliphatic hydrocarbon residue that is at least divalent and that may comprise 1 to 3 O-atoms, $L^2$ represents a lower alkylene of 1 to 6 C-atoms which may be branched or linear, $R^1$ represents hydrogen or a methyl group, $R^2$ represents hydrogen or a lower alkyl group of 1 to 6 C-atoms;

(II)

wherein

Ur represents a divalent or trivalent condensed urea residue;

Z represents O or $NR^{10}$ with $R^{10}$ representing alkyl containing 1 to 12 C-atoms;

$R^7$ represents a divalent hydrocarbon residue containing 2 to 25 C-atoms;

$R^8$ represents a hydrocarbon residue with a valence between 2 and 6, and containing 2 to 18 C-atoms, which can be linear or branched and which can be interrupted by upto 3 O atoms;

$R^9$ represents hydrogen or methyl;

α represents an integer from 1 to 5, and

β equals 2 or 3.

Preferably used monomers comprise one of the following residues as hydrocarbon residue A and/or $A^2$ of general formula (I):

Ia

Ib

Ic

Id wherein $R^5$ and $R^6$ each independently represent hydrogen or a lower alkyl of 1 to 6 C-atoms, s and t independently represent an integer from 1 to 6 and wherein the aliphatic hydrocarbon residues Ia, Ic and Id comprise 2 to 6 free valences.

Examples of monomers according to formula (I) suitable for use in accordance with the present invention are shown in table 1.

TABLE 1

| | |
|---|---|
| $CH_3-CH_2-C[CH_2O-(CH_2\underset{\underset{CH_3}{\mid}}{C}H-O-)_{2.4}-CO-(CH_2)_5-NHCOO-CH_2-CH_2-O-CO-\underset{\underset{CH_3}{\mid}}{C}=CH_2]_3$ | 1 |
| $CH_3-CH_2-C[CH_2O-(CH_2\underset{\underset{CH_3}{\mid}}{C}H-O-)_{2.4}-CO-(CH_2)_5-NHCOO-CH-(CH_2-O-CO-\underset{\underset{CH_3}{\mid}}{C}=CH_2)_2]_3$ | 2 |
| $C[CH_2O-CO-(CH_2)_5-NH-COO-CH_2-CH_2-OCO-CH=CH_2]_4$ | 3 |
| $C[CH_2O-CO-(CH_2)_5-NH-COO-CH_2-CH_2-OCO-\underset{\underset{CH_3}{\mid}}{C}=CH_2]_4$ | 4 |
|  | 5 |
| (compound 6 structure) | 6 | i and j are respectively 3.5 and 0.5 indicating that compound 6 is a mixture of compounds obtained by reacting i equivalents of glycerine-dimethacrylate and j equivalents of hydroxyethyl methacrylate as disclosed in DE 3,703,130.

$$[(CH_2=\underset{\underset{CH_3}{\mid}}{C}-COO-CH_2)_2-CH-OOCNH-(CH_2)_5-COO-CH_2]_i$$
$$[CH_2=\underset{\underset{CH_3}{\mid}}{C}-COO-CH_2-CH_2-OOCNH-(CH_2)_5-COO-CH_2]_j$$
$\diagdown C \diagup$   7 i and j are respectively 2.5 and 1.5 indicating that compound 7 is a mixture of compounds obtained by reacting i equivalents of glycerine-dimethacrylate and j equivalents of hydroxyethyl methacrylate as disclosed in DE 3,703,130.

$C[CH_2O-CO(CH_2)_5-NH-COO-CH-(CH_2-O-CO-\underset{\underset{CH_3}{\mid}}{C}=CH_2)_2]_4$   8

$(CH_2=\underset{\underset{CH_3}{\mid}}{C}-COO-CH_2)_2-CH-OOCNH-(CH_2)_5-CO-(O-\underset{\underset{CH_3}{\mid}}{C}HCH_2)_{2.4}-O-CH_2$
$[CH_2=\underset{\underset{CH_3}{\mid}}{C}-COO-CH_2-CH_2-OOCNH-(CH_2)_5-CO-(O-\underset{\underset{CH_3}{\mid}}{C}HCH_2)_{2.4}-O-CH_2]_2$
$\diagdown C(C_2H_5) \diagup$   9

$CH_3-CH_2-C[CH_2O-(CH_2\underset{\underset{CH_3}{\mid}}{C}H-O-)_{2.4}-CO-(CH_2)_5-NHCOO-CH_2-CH_2-O-CO-CH=CH_2]_3$   10

$C[CH_2O-CO-NH-CH_2-\underset{\underset{CH_3}{\mid}}{\overset{\overset{CH_3}{\mid}}{C}}-CH_2-CH-CH_2-CH_2-NH-COO-CH-(CH_2-O-CO-\underset{\underset{CH_3}{\mid}}{C}=CH_2)_2]_4$   11

$C[CH_2O-CO-NH-(CH_2)_6-NH-COO-CH-(CH_2-O-CO-\underset{\underset{CH_3}{\mid}}{C}=CH_2)_2]_4$   12

$C_2H_5-C[CH_2O-CO-NH-(CH_2)_6-NH-COO-CH-(CH_2-O-CO-\underset{\underset{CH_3}{\mid}}{C}=CH_2)_2]_3$   13

The fractal indexes in the formulas 1, 2 and 10 indicate that these formulas represent a mixture of compounds having a different length of the ethylene-oxide piece in said formulas the indexes thus representing an avarage of said ethylene-oxide piece. The formulas 14 to 23 represent a mixture of structural isomers and can be used in accordance with the present invention without separation of the isomers.

The monomers corresponding to general formula (I) are known and can be prepared according to the German patent application numbers 3,522,005, 3,703,080, 3,643,216, 3,703,130, 3,917,320 and 3,743,728.

In general monomer formula (II) preferred condensed urea residues represented by Ur are following structural units Examples of preferred useful monomers according to general formula (II) are listed below in table 2:

TABLE 2

TABLE 2-continued

Preferred monomers are polyethyleneglycol 400 diacrylate (SARTOMER 344), tris(2-hydroxyethyl)isocyanurate triacrylate (SARTOMER 368), triethyleneglycol dimethacrylate (SARTOMER 205), trimethylolpropane trimethacrylate (SARTOMER 350), and highly ethoxylated trimethylolpropane triacrylate (SARTOMER 9035).

Most preferred monomers are pentaerythritol triacrylate (SARTOMER 35), ethoxylated trimethylolpropane triacrylate (SARTOMER 454) and pentaerythritol tetraacrylate (SARTOMER 295) (Craynor Co., France).

An important parameter for the successful practice of the present invention is the binder/monomer ratio. This ratio can vary between 1/4 and 5/1. Since the cohesive strenght of the unexposed photosensitive layer decreases with higher temperature and increases with increasing amount of binder the temperature of the delamination (step (B)) has to be matched to the binder/monomer ratio (see furtheron).

The photoinitiator system, when present in the photosensitive layer, comprises one or more compounds which directly furnish free-radicals when activated by actinic radiation. It can also comprise a plurality of other compounds, e.g. spectral sensitizers, hydrogen donors.

Numerous conventional photoinitiators systems may be used provided they are compatible with the other ingredients of the element. Useful photoinitiators are ketoxime-esters. Preferred photoinitiator systems are 2,4,5-triphenylimidazolyl dimers in combination with chain transfer agents, or hydrogen donors, such as are disclosed in U.S. Pat. No. 3,479,185, U.S. Pat. No. 3,784,557, U.S. Pat. No. 4,311,783 and U.S. Pat. No. 4,622,286. Preferred hexaarylbisimidazoles (HABI) are 2-o-chloro-substituted hexaphenylbisimidazoles in which the other positions on the phenyl radicals are unsubstituted or substituted with chloro, methyl or methoxy. The most preferred initiator is o.-Cl-HABI, i.e., 2,2'-bis-(o-chloro-phenyl)-4,4,5,5',tetraphenyl-1,1'-bisimidazole (or simply "bisimidazole") corresponding to following chemical formula Hydrogen donor compounds useful as chain tranfer agents in the photopolymer layer include : 2-mercaptobenzoxazole, 2-mercaptobenzothiazole, 4-methyl-4H-1,2,4,-triazole-3-thiol, and the like. A preferred hydrogen donor is 2-mercaptobenzoxazole with following formula:

Although the HABI initiating systems described above are preferred, other initiating systems may be used in practicing this invention. Useful photoinitiators described in U.S. Pat. No. 2,760,863 include vicinal ketaldonyl alcohols, such as benzoin, pivaloin, acyloin ethers, e.g. benzoin methyl and ethyl ethers, and α-hydrocarbon-substituted aromatic acyloins, such as α-methylbenzoin. Further useful photoinitiators include quinoxaline compounds as described in U.S. Pat. No. 3,765,898, the vicinal polyketaldonyl compounds in U.S. Pat. No. 2,367,660, the α-carbonyls in U.S. Pat. Nos. 2,367,661 and 2,367,670, the acyloin ethers in U.S. Pat. No. 2,448,828, the triarylimidazolyl dimers in U.S. Pat. No. 3,479,185, the α-hydrocarbon substituted aromatic acyloins in U.S. Pat. No. 2,722,512, polynuclear quinones in U.S. Pat. Nos. 2,951,758 and 3,046,127, and s-triazines in U.S. Pat. No. 4,656,272.

The photoinitiator is preferably present in the photosensitive layer in an amount ranging from 2 to 30% by weight.

Many of the well known photoinitiator systems have limited applicability because they are activated only by UV radiation. For exposure in the visible region, e.g. by lasers, the use of so-called sensitizers is indispensable. A large number of free-radical generating systems have been used as sensitizers for the visible region for photopolymerizable compositions. U.S. Pat. No. 3,652,275 discloses selected bis(p-dialkylaminobenzylidene)ketones as sensitizers for HABI initiator systems. U.S. Pat. No. 4,162,162 discloses selected sensitizers derived from aryl ketones and p-dialkylaminoaldehydes. U.S. Pat. No. 4,987,230 and U.S. Pat. No. 4,987,230 also disclose sensitizers for HABI systems.

A preferred sensitizer is 7-diethylamino-4-methylcoumarin.

The photopolymerisable composition can be applied on top of the bismuth layer in two different ways. The photosensitive composition can be coated on a support serving furtheron as transparent cover sheet. Then both prepared packs (support+metal layer on the one hand, and photosensitive layer+cover sheet on the other hand) are laminated together. Alternatively, the photosensitive layer can be coated on top of the metal layer. Then an optionally subbed transparent cover sheet is laminated onto the photosensitive layer under the same conditions as described above.

Like the support the cover sheet is preferably composed of polyethylene terephthalate. When the photosensitive element is designed for contactexposure by a UV source the thickness of the PET is comprised preferably between 12 and 100 $\mu$m, most preferably between 12 and 50 $\mu$m. When the photosensitive element is meant for laser exposure the thickness preferably ranges between 50 and 200 $\mu$m, most preferably around 100 $\mu$m. When the cover sheet is subbed with subbing layer (2) the same co(vinylidenechloride-methylacrylate-itaconic acid) composition is preferred as for the subbing layer (1) of the original support. Optionally a so-called primer layer can be present on top of subbing layer (1) for improvement of the adhesive properties. A preferred primer layer contains gelatin, preferably at 0.25 à 0.35 g/m$^2$, colloidal silica such as KIESELSOL 300F (Bayer AG), preferably at 0.3 à 0.4 g/m$^2$, and a spacing agent on the base of polymethylmethacrylate, preferably having an average size of 2 à 3 $\mu$m and a coverage of about 0.001 g/m$^2$.

When the photosensitive layer is not sensitized to a visual part of the spectrum the image-wise exposure is performed in a conventional contact apparatus equipped with a UV light source. However, when the photosensitive layer is sensitized to a visual part of the spectrum an information-wise exposure by means of a laser can be performed, e.g. a Ar ion laser or a He—Ne laser. Curing by photopolymerisation can also be performed by an image-wise exposure to an electron beam. In this case the presence of a photoinitiator is not required.

By peeling apart the support and the cover sheet the metal layer covered with a part of the cohesively broken photosensitive layer adhere in the unexposed areas to the support or to the subbing layer (1) when present thus forming a positive metal image, whereas in the exposed areas the photopolymerised photosensitive layer and the metal layer adhere to said cover sheet or said subbing layer (2) when present thus forming a negative image.

Figure 1A:
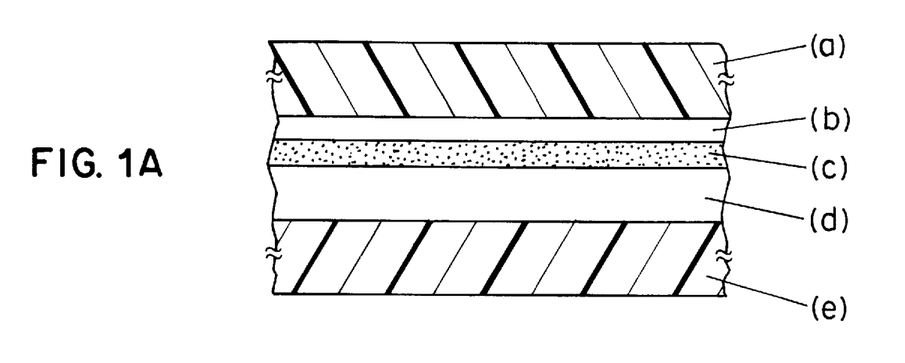
Figure 1B:
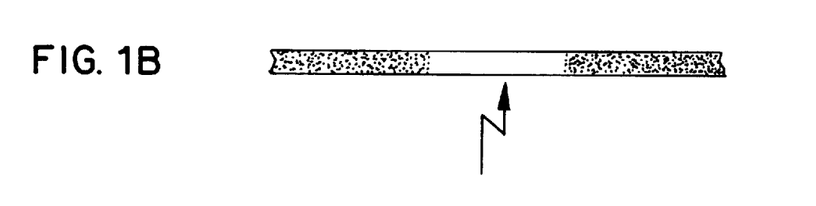
Figure 1C:
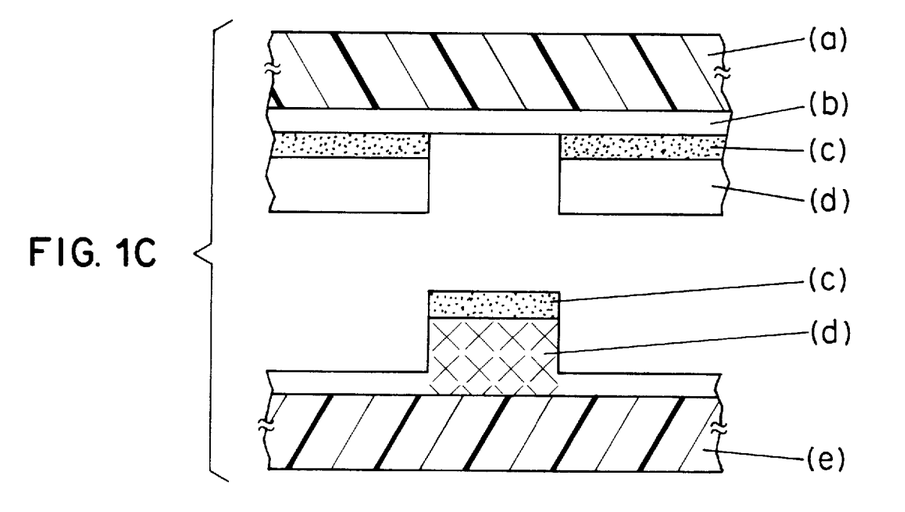

The original layer arrangement and the status after the peel apart step in the exposed and non-exposed areas are illustrated in fig. 1, wherein:

A=original layer arrangement

B=image-wise exposure
C=status after delamination
  (a)=support
  (b)=optional subbing layer (1)
  (c)=image forming layer, e.g. Bi layer
  (d)=photosensitive layer (xxxx=polymerised part)
  (e)=cover sheet As stated earlier the optimal delamination temperature is influenced by the binder/monomer ratio. This is illustrated by the table hereinafter wherein pentaerythritol triacrylate (SARTOMER 444) is used as a monomer and VITEL PE200 copolyester is used as a binder.

| Binder/monomer | optimal delamination temp. |
| --- | --- |
| 1/4 to 1/2 | room temp. |
| about 1/1 | 40–60° C. |
| 2/1 to 5/1 | 70–100° C. |

In general it can be stated that the optimal delamination temperature will be determined by the binder/monomer ratio, the melt viscosity of the monomer and the $T_g$ of the binder.

In a preferred embodiment the parts of the cohesively broken photosensitive layer present on top of the positive metal image are subjected to an overall curing step. This is done by means of an overall UV or visible light exposure.

The present invention will now be illustrated by the following examples without however being limited thereto.

EXAMPLES

Example 1
preparation of photosensitive elements

Onto a 100 μm thick polyethylene terephthalate film (PET) (1) provided with a variable subbing layer (see table 2 furtheron) a 300 nm thick black bismuth layer was vapour deposited at $10^{-3}$ mbar in a LEYBOLD-HEREAUS type 1140 vacuum evaporator.

Three photopolymerisable coating compositions were prepared containing various amounts of the following compounds compound A: VITEL PE200=copoly(ethyleneisophthalate-ethyleneterephtalate)=binder; this compound is dissolved for 10% either in a methylethylketone/ethylacetate 75/25 mixture (compound $A_1$ in table 1 or for 10% in a toluene/ethylacetate mixture 80/20 (compound $A_2$ in table 2);

compound B photopolymerisable monomer (PETRI) with formula:

compound C: 4,4'-bis(diethylamino)benzophenone with following formula:

compound D: photoinitiator benzophenone with formula:

compound E: inhibitor IONOL (2,6-di-t.-butyl-4-methyl-phenol) with following formula:

compound F spectral sensitizer with formula:

compound G photoinitiator o.-Cl-HABI with formula:

compound H: toning agent benzoxazine, formula:

solvent mixture toluene/ethylacetate (Tol/EtAc) 80%/20% solvent mixture methylethylketone/ethylacetate (MEK/EtAc) 75%/25%;

The composition of the three coating solutions for the photosensitive layers (PSL) is represented in table 1 (all amounts expressed in grams):

TABLE 1

| compound | PSL 1 | PSL 2 | PSL 3 |
| --- | --- | --- | --- |
| $A_1$ | 24 | — | — |
| $A_2$ | — | 23.5 | 30 |
| B | 8 | 8.2 | 6.2 |
| C | 0.1 | 0.1 | — |
| D | 1 | 1 | — |
| E | 0.2 | 0.2 | 0.14 |
| F | — | — | 0.14 |
| G | — | — | 1.2 |
| H | — | — | 0.07 |
| Tol/EtAc 80/20 | — | 62.5 | 62.3 |
| MEK/EtAc 75/25 | 66.7 | — | — |

The photopolymerisable composition can be applied on top of the bismuth layer in two different ways. In most examples (see table 2 furtheron) the photosensitive composition is coated at a wet thickness of 50 μm on a 63 μm thick subbed polyethylene terephthalate film (5). Then both prepared packs are laminated together, the bismuth layer (3) and the photosensitive layer (1, 2 or 3) facing each other, in a CODOR LPP650 laminator (Dorned B.V. The Netherlands) at a roller temperature of 90° C. and a conveying speed of 30 cm/min. Alternatively, only in sample 2B (see also table 2), the photosensitive layer is coated on top of the bismuth layer (3) at a wet thickness of 50 μm. Then a subbed 63 μm thick polyethylene terephthalate film (5) is laminated onto the photosensitive layer under the same conditions as described above.

The different combinations, giving rise to a series of complete photosensitive elements, are represented in table 2:

TABLE 2

| Sample No. | PSL No., coated on | laminated to |
| --- | --- | --- |
| 1A | 1, + PET (5) + sub. (2a) | Bi (3) + sub. (2a)* + PET (1) |
| 1B | 1, + PET (5) + sub. (2a) | Bi (3) + sub. (2b)* + PET (1) |
| 1C | 1, + PET (5) + sub. (2a) | Bi (3) + sub. (2c)* + PET (1) |
| 1D | 1, + PET (5) + sub. (2a) | Bi (3) + sub. (2d)* + PET (1) |
| 2A | 2, + PET (5) + sub. (2a) | PET (1) + sub. (2a) + Bi (3) |
| 2B | 2, + Bi (3) + sub. (2a) + PET (1) | PET (5) |
| 3 | 3, + PET (5) + sub. (2a) | Bi (3) + sub. (2a) + PET (1) |

*: sub. (2a) = a subbing layer, containing silica particles and co(vinylidenechloride-methacrylate-itaconic acid; 88/10/2), at a dry coverage of 0.2 g/m²;
sub. (2b) = a subbing layer, containing co(styrene-butadiene), at a dry coverage of 0.1 g/m²;
sub. (2c) = a subbing layer, containing polymethylmethacrylate, at a dry coverage of 0.1 g/m²;
sub. (2d) = a subbing layer, containing MOWILITH CT5 (Hoechst AG), being co(vinyl acetate-crotonic acid), at a dry coverage of 0.1 g/m².

exposure and processing

All samples of the series of finished photosensitive elements of table 2, with the exception of sample 3, were exposed to ultraviolet radiation. In a CDL 1501 contactexposure apparatus, marketed by Agfa-Gevaert N.V., the samples were contactexposed through a photographic mask in contact with PET (5) for 12 s (1500 μW/cm²).

Sample 3 was laser exposed by a scanner equiped with an Ar ion laser emitting at 488 nm. The laser spot diameter (1/e²) was 30 μm, the drum speed was 8.8 m/s, and the energy on film was $3.10^3$ J/m².

While PET (1) was kept flat PET (5) was peeled off at an angle of 180° (peel-back method). A separation pattern as explained by FIG. 1 (see section Detailed Description) was obtained. The positive image was subjected to an overall curing by an exposure for 60 s on the same CDL 1501 apparatus.

Results

The obtained image data of the positive image are represented in table 3.

TABLE 3

| sample | Dmax | Dmin | minimal line width rendering range | % dot rendering |
| --- | --- | --- | --- | --- |
| 1A | 3.75–4.44 | 0.10 | 15 μm | 3–96% |
| 1B | 2.56–3.00 | 0.12–014 | 15 μm | 3–96% |
| 1C* | 3.00–3.20 | 0.28–0.49 | — | — |
| 1D* | 2.70–3.76 | 0.14–0.22 | — | — |
| 2A | 4.15 | 0.08 | 16 μm | 2–96% |
| 2B | 2.8–3.6 | 0.08 | 12 μm | 2–96% |
| 3 | 3.2–3.9 | 0.08 | 10 μm | 2–96% |

*: no good image differentiation

The obtained results indicate that it is in principle possible to realize a dry processable contact duplicating film or image-setting film by means of the combination of a vapour deposited bismuth layer on a subbed PET film in combination with a photopolymerisable layer. Thin metal layers as density providing elements offer the advantage of a high Dmax and an excellent edge sharpness of the imaged obtained by delamination. The image quality is to a large extent dependent on the nature of the subbing layer chosen.

Example 2

This example illustrates a composition wherein a warm delamination step is required.

The composition of the coating solution for the photosensitive layer was as follows:

| DYNAPOL L411 (Hüls Troisdorf AG) | 7.6 g |
| --- | --- |
| SARTOMER 351 | 3.3 g |
| compound C | 0.1 g |
| compound G | 0.34 g |
| compound H | 0.08 g |
| MEK to give | 100 ml |

This composition was coated at a wet thickness of 50 μm onto a 100 μm thick polyethylene terephthalate sheet provided with a subbing layer (2a) (cf. previous example). Then this pack was laminated to a pack consisting of a 100 μm thick polyethylene terephthalate support+a subbing layer (2a)+a bismuth layer similar to the previous example.

The image-wise exposure was a contactexposure performed in a CDL 1501 contactapparatus, marketed by Agfa-Gevaert N.V. The exposed layer pack was delaminated by means of a configuration with stable delamination point, formed by two rollers with unequal diameter. The temperature of the under roller, an aluminium roller with a diameter of 12 cm, was established at 90° C. The unheated upper roller had a diameter of 2.5 cm and the material was delaminated at a speed of 65 cm/min. After delamination a non-tacky positive image was obtained having a Dmax (UV) of 3.25, a Dmin of 0.09, and a dot rendering range between 2 and 98%. An overall curing was applied to the positive image for 20 s on a CDL 1501.

We claim:

1. A photosensitive element comprising, in order:
   (A) a support;
   (B) an image forming layer comprising at least one layer made from a material selected from the group consisting of a metal, a metal compound and a mixture of a metal and a metal compound;
   (C) a photosensitive layer comprising a free radical polymerisable monomer having at least two ethylenically unsaturated groups and a binder; and
   (D) a transparent cover sheet;
   wherein when said element has not yet been exposed to actinic radiation, the cohesive strength of said photosensitive layer is lower than both the adhesive strength between said metal layer and said support and the adhesive strength between said photosensitive layer and said cover sheet, whereas, upon exposure to actinic radiation, the cohesive strength of said photopolymerised photosensitive layer and the adhesive strength of said photopolymerised photosensitive layer to said metal layer both become higher than the adhesive strength between said metal layer and said support thereby creating a cohesive rupture of the unexposed portions of said photosensitive layer when said support and said cover sheet are peeled apart.

2. A photosensitive element according to claim 1 wherein said image forming layer comprises at least one bismuth layer.

3. A photosensitive element according to claim 2 wherein said bismuth layer has an optical density (UV) of at least 3.0.

4. A photosensitive element according to claim 2 wherein said bismuth layer has an optical reflection, measured at the bismuth side, of at most 10%.

5. A photosensitive element according to claim 2 wherein said bismuth layer has a bismuth oxide content of at least 20%.

6. A photosensitive element according to claim 2 wherein said bismuth layer has a porosity (defined as actual density divided by theoretical density) between 60 and 70%.

7. A photosensitive element according to claim 1 wherein said free radical polymerisable monomer is chosen from the group consisting of pentaerythritol triacrylate, ethoxylated trimethylolpropane triacrylate and pentaerythritol tetraacrylate.

8. A process for the formation of a metal image comprising the following steps:
   (A) exposing information-wise by actinic radiation a photosensitive element comprising, in order:
      (i) a support;
      (ii) an image forming layer comprising at least one layer made from a material selected from the group consisting of a metal, a metal compound and a mixture of a metal and a metal compound;
      (ii) a photosensitive layer comprising a free radical polymerisable monomer having at least two ethylenically unsaturated groups and a binder; and
      (iv) a transparent cover sheet;
   wherein when said element has not yet been exposed to actinic radiation, the cohesive strength of said photosensitive layer is lower than both the adhesive strength between said metal layer and said support and the adhesive strength between said photosensitive layer and said cover sheet, whereas, upon exposure to actinic radiation, the cohesive strength of said photopolymerised photosensitive layer and the adhesive strength of said photopolymerised photosensitive layer to said metal layer both become higher than the adhesive strength between said metal layer and said support; and
   (B) peeling apart said support and said cover sheet, whereby, in the unexposed areas, said metal layer and part of the cohesively broken photosensitive layer adhere to the support thus forming a positive metal image, whereas in the exposed areas the photopolymerised photosensitive layer and the metal layer adhere to said cover sheet thus forming a negative image.

9. A process according to claim 8 further comprising the following step (C):curing by means of UV or visible light the parts of the cohesively broken photosensitive layer present on top of said positive metal image.

10. A process according to claim 8 wherein said actinic radiation for said information-wise exposure is chosen from the group consisting of UV radiation, laser radiation in the visible region, and electron beam radiation.

11. A process according to the claim 8 wherein said image forming layer comprises at least one bismuth layer.

12. A process according to claim 11 wherein said bismuth layer has an optical density (UV) of at least 3.0.

13. Process according to claim 11 wherein said bismuth layer has an optical reflection, measured at the bismuth side, of at most 10%.

14. A process according to claim 11 wherein said bismuth layer has a bismuth oxide content of at least 20%.

15. A process according to claim 11 wherein said bismuth layer has a porosity (defined as actual density divided by theoretical density) between 60 and 70%.

16. A photosensitive element according the claim 1 further comprising at least one element selected from the groups consisting of:
   (A) a subbing layer (1) between said support and said image forming layer;
   (B) a subbing layer (2) between said photosensitive layer and said transparent cover; and
   (C) a photoinitiator as part of or mixed into said photosensitive layer;
   wherein when said element has not yet been exposed to actinic radiation, the cohesive strength of said photosensitive layer is lower than both the adhesive strength between said metal layer and said support or said subbing layer (1) and the adhesive strength between said photosensitive layer and said cover sheet or said subbing layer (2), whereas, upon exposure to actinic radiation, the cohesive strength of said photopolymerised photosensitive layer and the adhesive strength of said photopolymerised photosensitive layer to said metal layer both become higher than the adhesive strength between said metal layer and said support or said subbing layer (1).

17. A process according to claim 8 wherein said photosensitive element of step (A) further comprises at least one element selected from the groups consisting of:

a subbing layer (1) between said support and said image forming layer;

a subbing layer (2) between said photosensitive layer and said transparent cover; and a photoinitiator as part of or mixed into said photosensitive layer;

wherein when said photosensitive element has not yet been exposed to actinic radiation, the cohesive strength of said photosensitive layer is lower than both the adhesive strength between said metal layer and said support or said subbing layer (1) and the adhesive strength between said photosensitive layer and said cover sheet or said subbing layer (2), whereas, upon exposure to actinic radiation, the cohesive strength of said photopolymerised photosensitive layer and the adhesive strength of said photopolymerised photosensitive layer to said metal layer both become higher than the adhesive strength between said metal layer and said support or said subbing layer (1); and wherein step (B) comprises peeling apart said support and said cover sheet, whereby, in the unexposed areas, said metal layer and part of the cohesively broken photosensitive layer adhere to the support or to the subbing layer (1) thus forming a positive metal image, whereas in the exposed areas the photopolymerised photosensitive layer and the metal layer adhere to said cover sheet or said subbing layer (2) thus forming a negative image.

18. A process according to claim 17 further comprising the following step (C): curing by means of UV or visible light the parts of the cohesively broken photosensitive layer present on top of said positive metal image.

* * * * *